(12) United States Patent
Yoshida et al.

(10) Patent No.: US 7,371,471 B2
(45) Date of Patent: May 13, 2008

(54) ELECTROMAGNETIC NOISE SUPPRESSING THIN FILM

(75) Inventors: Shigeyoshi Yoshida, Sendai (JP); Hiroshi Ono, Sendai (JP); Yutaka Shimada, Sendai (JP); Tetsuo Itoh, Sendai (JP)

(73) Assignee: NEC TOKIN Corporation, Miyagi (JP)

( * ) Notice: Subject to any disclaimer, the term of this patent is extended or adjusted under 35 U.S.C. 154(b) by 46 days.

(21) Appl. No.: 11/075,556

(22) Filed: Mar. 8, 2005

(65) Prior Publication Data

US 2005/0208293 A1 Sep. 22, 2005

Related U.S. Application Data

(60) Provisional application No. 60/551,433, filed on Mar. 8, 2004.

(51) Int. Cl.
*B32B 9/00* (2006.01)
*B22F 3/00* (2006.01)

(52) U.S. Cl. .................. 428/692.1; 428/293.4; 428/293.7; 428/294.4; 428/404; 428/900; 252/62.51 R; 252/62.55; 361/816; 361/818

(58) Field of Classification Search ............ 252/62.55, 252/62.51 R; 428/692.1, 404, 900, 293.4, 428/293.7, 294.4
See application file for complete search history.

(56) References Cited

U.S. PATENT DOCUMENTS

| | | | | |
|---|---|---|---|---|
| 4,012,738 | A * | 3/1977 | Wright | 342/1 |
| 4,343,901 | A * | 8/1982 | DeFilippi | 435/176 |
| 4,367,153 | A * | 1/1983 | Seiver et al. | 252/62.55 |
| 6,448,491 | B1 * | 9/2002 | Sato et al. | 174/389 |
| 6,521,140 | B2 * | 2/2003 | Yoshida et al. | 252/62.54 |
| 6,653,573 | B2 * | 11/2003 | Awakura et al. | 174/256 |
| 6,695,985 | B2 * | 2/2004 | Igarashi et al. | 252/518.1 |
| 6,903,440 | B2 * | 6/2005 | Yoshida et al. | 257/593 |
| 6,962,753 | B1 * | 11/2005 | Yoshida et al. | 428/469 |
| 7,060,374 | B2 | 6/2006 | Kobayashi et al. | |
| 7,075,163 | B2 * | 7/2006 | Yoshida et al. | 257/428 |

FOREIGN PATENT DOCUMENTS

| | | |
|---|---|---|
| EP | 0667643 A1 | 8/1995 |
| EP | 1148773 A1 | 10/2001 |
| JP | 61022454 | 1/1986 |
| JP | 1162214 | 6/1989 |
| JP | 2-201904 A | 8/1990 |
| JP | 5258268 | 10/1993 |
| JP | 5342551 | 12/1993 |
| JP | 9-115707 A | 5/1997 |
| JP | 11-186035 A | 7/1999 |
| JP | 2001101651 | 4/2001 |
| JP | 2001210518 | 8/2001 |
| JP | 2001-284878 A | 10/2001 |
| JP | 2001291225 | 10/2001 |
| JP | 2002-158486 A | 5/2002 |
| JP | 2003-197410 A | 7/2003 |
| JP | 2003-297628 A | 10/2003 |
| JP | 2003-297629 A | 10/2003 |
| JP | 2004-095937 A | 3/2004 |
| WO | 01/54145 A1 | 1/2001 |

OTHER PUBLICATIONS

Itoh, T., et al., "Nanostructures of NiFeB2O3,MgF granular films with high potential as thin film electromagnetic . . .," NAMM 2002, Jun. 9-13, 2002, Kloster Irsee, Germany.
Li, W., et al., "Permeability and resistivity of Ni-Fe-oxide-composite-films," Mag-02-28~38, The Paper of Technical Meeting on Magnetics, IEE Japan, Mar. 14, 2002.
Search report from Japanese Patent Office in respect of JP2002-256532, mailed May 10, 2006, including listing of references and field of search.
Ohnumas, S., et al.; "Noise suppression effect by nano-graular magnetic films at GHz frequency," Magnetics Soc. of Japan, 2003, pp. 17-24.
Yoshida, S, et al., "High-frequency noise suppression in downsized circuits using magnetic granular films," IEEE Trans. on Magnetics, 2001, vol. 37, No. 4, pp. 2401-2403.

* cited by examiner

*Primary Examiner*—Cathy F. Lam
(74) *Attorney, Agent, or Firm*—Bradley N. Ruben

(57) ABSTRACT

An electromagnetic noise suppressing thin film has a structure including an inorganic insulating matrix made of oxie, nitride, fluoride, or a mixture thereof and columnar-structured particles made of a pure metal of Fe, Co, or Ni or an alloy containing at least 20 weight % of Fe, Co, or Ni and buried in an inorganic insulating matrix.

32 Claims, 13 Drawing Sheets

(c) (m)

ELECTROMAGNETIC NOISE SUPPRESSING THIN FILM

CROSS REFERENCE TO RELATED APPLICATION

This application claims the benefit of U.S. Provisional Application No. 60/551,433 filed Mar. 8, 2004.

BACKGROUND OF THE INVENTION

The present invention relates to a magnetic material having a high magnetic permeability in a high-frequency region and, in particular, to an electromagnetic noise suppressing thin film which suppresses or absorbs a high-frequency current acting as noise.

Following rapid spread of a mobile telephone and development of a wireless LAN, an electromagnetic environment problem including an influence of an electromagnetic wave upon a human body becomes publicly recognized. Under the circumstances, attention is increasingly directed to "electromagnetic compatibility, EMC" considering both suppression of emission of the electromagnetic wave from a wide range of electronic devices within a certain limit and improvement of noise immunity against an influence from the surroundings.

In recent years, the EMC is directed to electronic apparatuses, such as a mobile telephone or a CPU used in a PC, operable in a quasi microwave band (several hundreds MHz to several GHz). For the EMC in such a high-frequency region, it is an urgent need to develop a material having a high magnetic loss ($\mu''$) and a magnetic resonance frequency in the above-mentioned high-frequency region as well as a high electric resistance.

As typical conventional magnetic materials that can be used at a high frequency, there are known a ferrite, a metal thin film, a multilayer film comprising a combination of a metal and a nonmagnetic insulating material, a granular thin film, and the like.

The ferrite has a very high electric resistance and occurrence of an eddy current at a high frequency is very low. Therefore, the ferrite can be used in bulk. However, at a high frequency of several tens MHz or more, resonant vibration of a domain wall and a spin resonance phenomenon occur so that a so-called Snoek's limit appears. In order to further increase the frequency, it is effective to form a thin film of several μm or less so that a shape magnetic anisotropy is increased to thereby raise the Snoek's limit. However, formation of a ferrite phase having a high magnetic permeability requires a process at about 1000° C. In this event, the thin film is difficult to form. Therefore, practical application has never been reported.

The metal thin film typically uses a permalloy ($Ni_{80}Fe_{20}$) or an amorphous metal and achieves a very high magnetic permeability. However, because of its very low electric resistance, an eddy current tends to be generated. Therefore, at a higher frequency, the thickness of the metal thin film is limited to be smaller. Particularly at the frequency on the order of GHz or more, the problem of the eddy current occurs unless the thickness is 0.1 μm or less.

In view of the above, use is made of the above-mentioned multilayer film, i.e. a thin film material in which metal thin films and insulator thin films such as oxide thin films are laminated so as to suppress occurrence of the eddy current. However, since the magnitude of overall magnetization is reduced and a fabrication process becomes complicated, use of the multilayer film is limitative.

The granular thin film is a recently-developed thin film having a granular structure. In the granular thin film, fine particles of a ferromagnetic metal having an isotropic shape approximate to a spherical shape are dispersed in a matrix such as oxide, thereby realizing an electric resistance (up to $10^3$ [$\mu\Omega$cm]) higher than that of a metal by several figures. The granular structure is a structure in which fine magnetic metal particles having a diameter of 10 nm or less are deposited in the oxide. Specifically, the granular structure is produced by a thin film fabrication technique such as sputtering. The granular thin film can have a high electric resistance and a strong magnetic anisotropy due to anisotropic coupling of the fine particles. It is therefore possible to suppress or control occurrence of a spin resonance phenomenon in a GHz band. Accordingly, the granular thin film is considered to have a wider application range as compared with the conventional thin film materials.

However, it has been found out that, when the granular thin film is disposed near a transmission line for use as an EMC measure, reflection of a signal transmitted through the transmission line becomes remarkable in the high-frequency band of several hundreds MHz or more. In order to prevent such reflection, the electric resistance must be yet higher by another several figures.

Thus, the granular thin film must have a yet higher electric resistance. However, there are following problems.

First, each of the fine ferromagnetic metal particles forming the granular structure itself has a diameter of several nanometers and, in an isolated state, loses ferromagnetic properties due to thermal agitation at room temperature (a phenomenon called superparamagnetism). In order to make the fine particles have the ferromagnetic properties, magnetic coupling is induced between the fine particles to thereby overcome the thermal agitation. In this event, the fine particles show magnetic properties as a group behavior due to the magnetic coupling and exhibit a high magnetic permeability. Thus, in order to obtain the properties as a high-magnetic-permeability thin film, the magnetic coupling between the fine particles is essential and indispensable. For the magnetic coupling, the presence of metallic coupling between the fine particles in the insulating material is necessary. Such metallic coupling causes a decrease in electric resistance. Thus, the high magnetic permeability and the high electric resistance are conflicting parameters. Accordingly, in the granular structure, the electric resistance has an upper limit.

SUMMARY OF THE INVENTION

It is therefore an object of the present invention to provide an electromagnetic noise suppressing thin film having a columnar structure which is capable of suppressing superparamagnetism and increasing an electric resistance and which is capable of controlling a spin resonance phenomenon.

In order to accomplish the above-mentioned object, the present inventors have determined a design principle for an electromagnetic noise suppressing material, found a novel technique capable of embodying the design principle, and finally made the present invention.

According to the present invention, there is obtained an electromagnetic noise suppressing thin film having a structure including an inorganic insulating matrix made of oxide, nitride, fluoride or a mixture thereof and columnar-structured particles made of a pure metal of Fe, Co, or Ni or an alloy containing at least 20 weight % of Fe, Co, or Ni and buried in the inorganic insulating matrix.

DESCRIPTION OF THE PREFERRED EMBODIMENT

Figure 1:
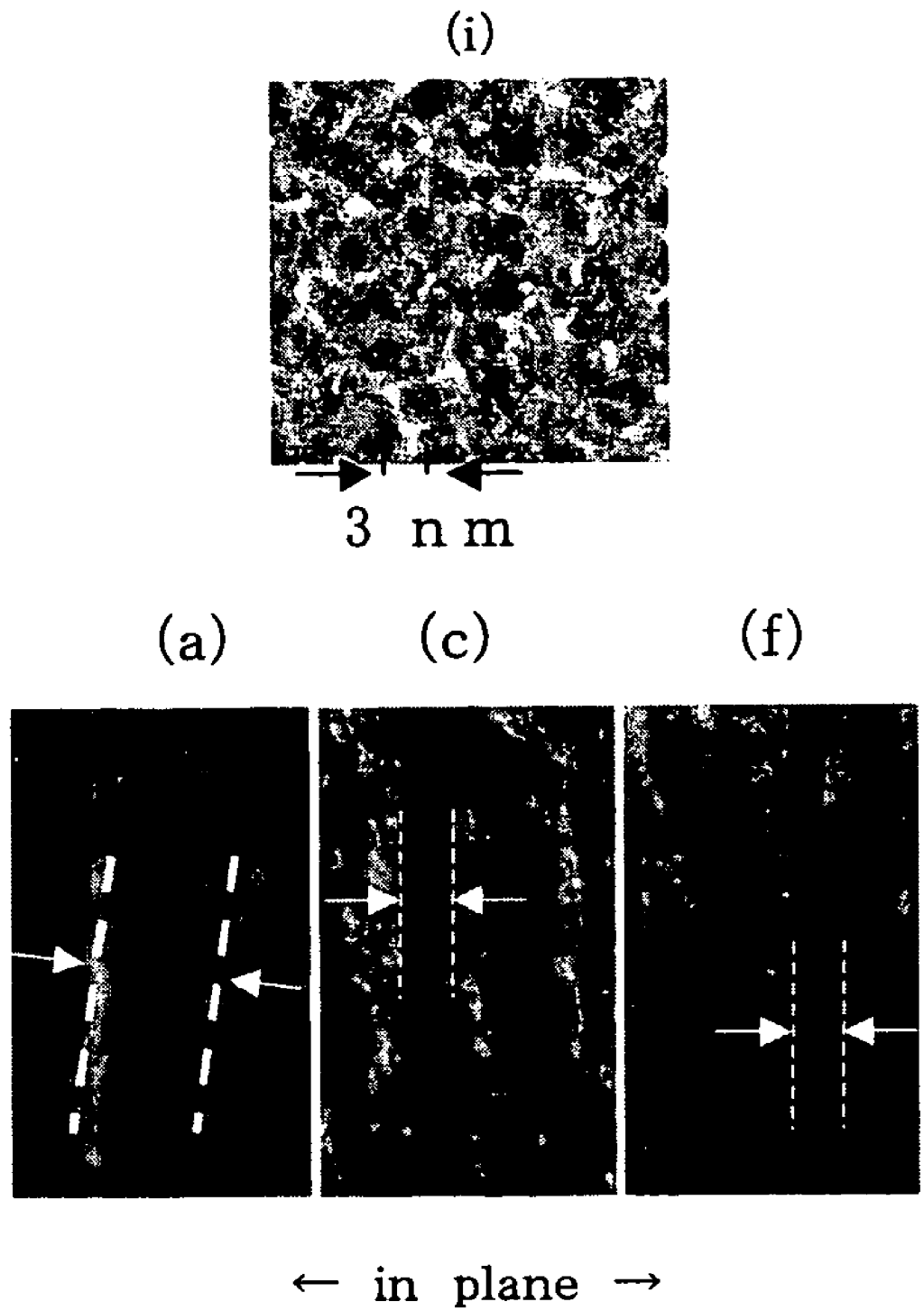
FIG. 1 shows transmission electron microscopic images of a thin film having a granular structure and deposited by sputtering in a comparative example (i) and thin films having a columnar structure and deposited by vapor deposition in examples (a), (c), and (f) of the present invention.

First, the principle of the present invention will be described.

In a granular structure obtained by sputtering, fine particles have an approximately spherical shape. In this event, the condition causing occurrence of superparamagnetism is represented by the following formula (1).

$$\alpha K u V / k T < 1, \quad (1)$$

where k is a Boltzmann constant, T, a temperature (Kelvin, K), Ku, a magnitude of an inherent magnetic anisotropy of a fine metal particle, V, a volume of the particle, and α, a proportionality constant depending upon the manner how a relaxation time is determined. The size of Fe or Co fine particles in a high-electric-resistance granular thin film is about 5 nm. The above-mentioned condition completely falls within the range of superparamagnetism or on the border of superparamagnetism.

In order to suppress occurrence of the superparamagnetism in the above-mentioned case, proposal is made of two approaches as follows:

(i) To increase the value of Ku; or (ii) To magnetically couple the fine particles to one another. In case of the granular thin film, magnetic interaction between the fine particles mentioned in (ii) is present so that the superparamagnetism can be suppressed. It is assumed here that the superparamagnetism is suppressed in the manner mentioned in (ii). In this event, if the content of oxide is increased in order to increase an electric resistance, the magnetic coupling is released so that the superparamagnetism appears. Therefore, it is difficult to further increase the electric resistance by the above-mentioned approach (ii). As a consequence, in order to further increase the electric resistance, it is required to increase the value of Ku of each individual fine particle. In the present invention, in order to increase the value of Ku, the shape of each fine particle is artificially controlled to thereby provide a shape magnetic anisotropy. That is, the condition under which the superparamagnetism does not appear is given by the following formula (2).

$$\alpha K_{total} V / k T > 1, K_{total} = Ku + Kus \quad (2)$$

Herein, Kus represents a magnitude of magnetic anisotropy due to the shape of the fine particle (shape magnetic anisotropy) and $K_{total}$ represents a magnitude of magnetic anisotropy given by a vector sum of Kus and an inherent magnetic anisotropy (crystal magnetic anisotropy, etc.) of the fine metal particle. The magnitude of the shape magnetic anisotropy is represented by the following formula (3).

$$Kus = (1/2) N d M s^2, \quad (3)$$

where Nd is a demagnetizing field coefficient and Ms is a saturation magnetization.

When the fine metal particle is a columnar-structured particle such as a rod shape extending in a longitudinal direction or a cylindrical or an elliptical shape near to the rod shape and when the length of the columnar-structured particle is sufficiently long, Nd is 4π in the longitudinal direction and zero in a direction perpendicular to the longitudinal direction. Therefore, Kus is given by the following formula (4).

$$Kus = 2\pi M s^2 \quad (4)$$

Thus, if the granular structure is not a group of spherical particles but includes a parallel arrangement of rod-like particles, it is possible to reduce a superparamagnetism critical volume. Therefore, the electric resistance can be increased without requiring magnetic coupling between the particles in order to suppress occurrence of the superparamagnetism.

In this case, a magnetic resonance frequency fr is given by:

$$fr = \gamma \times (2K_{total}/Ms), \quad (5)$$

where γ represents a gyromagnetic coefficient. Thus, the magnetic permeability and the magnetic resonance frequency can be controlled by changing a material composition and $K_{total}$. $K_{total}$ depends on the shape of the fine particle and, therefore, can be controlled by selecting an appropriate material as an insulating matrix. Further, by controlling the composition of metal or alloy as a material of the columnar-structured particle and the shape of the columnar-structured particle, the magnetic permeability, the magnetic resonance frequency, and the electric resistance can be set to desired values.

The present inventors have made the present invention as a novel technique capable of embodying the design principal described above.

Specifically, the present invention provides an electromagnetic noise suppressing or absorbing thin film having a structure including an inorganic insulating matrix made of oxide, nitride, fluoride or a mixture thereof and columnar-structured particles made of a pure metal of Fe, Co, or Ni or an alloy containing at least 20 weight % of Fe, Co, or Ni and buried in the inorganic insulating matrix. The columnar-structured particles are formed by a soft magnetic material. The reason why oxide, nitride, and fluoride are used as the insulating matrix is as follows. Since these materials are low in generated free energy and thermally stable, phase separation upon film formation is distinct by the use of these materials. In order to obtain a high magnetic permeability, the columnar-structured particles are preferably formed by a pure metal of Fe, Co, or Ni or an alloy comprising a combination thereof. Herein, the columnar-structured particles thus formed have a large shape magnetic anisotropy, which is a main factor determining magnetic properties. However, a crystal magnetic anisotropy or a magnetic anisotropy due to crystal deformation have some influences and considerably degrade soft magnetic properties. In view of the above, if the material is expected to have a higher magnetic permeability, it is more preferable to use a metal, such as $Ni_xFe_{(100-x)}$ (75≦x≦85 at %), having a crystal magnetic anisotropy or a magnetostriction nearly equal to 0. In order to obtain a high magnetic resonance frequency, it is effective to use a metal having a high Ms as will be understood from the above-mentioned formulae (2), (3), (4), and (5). Therefore, use of a high-saturation-magnetization metal, such as Fe or $Fe_yCo_{(100-y)}$ (50<y<70 at %), is effective.

In the above-mentioned electromagnetic noise suppressing thin film, each columnar-structured particle desirably has a single domain structure. With the single domain structure, no domain wall resonance appears and, therefore, a higher magnetic permeability is expected even at a high frequency (GHz). Further, a ferromagnetic resonance frequency can easily be controlled by spin magnetic resonance. Desirably, the dimension ratio of the columnar-structured particle (L/D, where L represents the length of the columnar-structured particle and D represents the width of the columnar-structured particle) is within the range of 1<L/D≦1000.

If 1≧L/D, an easy magnetization axis does not lie in the longitudinal direction so that a uniaxis anisotropy is not provided. Therefore, the superparamagnetism cannot be suppressed. When the columnar-structured particle stands upright in the plane and comprises a single continuous rod-like structure, the length L of the columnar-structured particle is considered to be substantially equal to the entire film thickness. In the meanwhile, it is understood that, if the film is deposited by vapor deposition, the limit of the film thickness is approximately 10 μm in view of the mechanical strength. The diameter D of the columnar-structured particle is minimum when the columnar-structured particle has the single domain structure. Taking into account unit cells of a component element or elements and the film strength, a maximum value of L/D is 1000.

Further, in the electromagnetic noise suppressing thin film, each columnar-structured particle has the easy magnetization axis in the longitudinal direction thereof and a plurality of the columnar-structured particles stand in parallel to one another via the inorganic insulating matrix. Therefore, the variance or dispersion of the magnetic permeability is small and the rise of the magnetic resonance loss with respect to the frequency is sharp. Accordingly, it is possible to easily control the resonance frequency and its frequency band. A gap or spacing between every adjacent ones of the columnar-structured particles (the thickness of the insulating matrix present in the gap) in a diameter direction of the columnar-structured particles is within the range of 1 nm to 100 nm. The reason is as follows. If the gap is less than 1 nm, magnetic exchange coupling acts between the columnar-structured particles so that the frequency characteristic of the magnetic permeability is degraded. On the other hand, if the gap is more than 100 nm, those components exhibiting magnetism are reduced so that a noise suppression effect is reduced.

In order to improve the noise suppression characteristic in the above-mentioned electromagnetic noise suppressing thin film, it is effective to laminate a plurality of layers having a desired resonance frequency, i.e., a plurality of layers including the columnar-structured particles equal in dimension ratio (L/D, where L represents the length of the columnar-structured particle and D represents the width of the columnar-structured particle). These layers (i.e., the layers including the columnar-structured particles buried in a matrix) may be referred to as columnar structure layers. In this event, a gap between every adjacent ones of the columnar-structure layers stacked on one another via the insulating matrix (the thickness of the insulating matrix present in the gap) is within the range of 1 nm to 100 nm in a laminating or stacking direction. The reason is as follows. If exchange coupling is exerted between these layers, the resonance frequency changes. In order to avoid this, the gap of 1 nm or more is required. The gap of 100 nm or more is not preferable because those components exhibiting magnetism are decreased so that the noise suppression effect is reduced.

If each of the columnar structure layers is a magnetic layer comprising columnar-structured particles different in dimension ratio (L/D, where L represents the length of the columnar-structured particle and D represents the width of the columnar-structured particle) from those in the other layers, the electromagnetic noise suppressing thin film having the above-mentioned multilayer structure has a plurality of magnetic resonance frequencies equal in number to the columnar structure layers.

Further, an absolute value $|\lambda_s|$ of a saturation magnetostriction constant of the electromagnetic noise suppressing thin film is preferably within the range of $|\lambda_s| \leq 60$ ppm. More preferably, $|\lambda_s| \leq 6$ ppm because a higher magnetic permeability is obtained. The d.c. resistivity of the electromagnetic noise suppressing thin film is preferably within the range of $10^2$ to $10^9$ mWcm, more preferably within the range of $10^4$ to $10^7$ mWcm in view of electromagnetic noise suppression performance. In the electromagnetic noise suppressing thin film, an increase in resistivity represents a monotonous increase in volume occupation rate of the insulating matrix. Therefore, in the range of $10^4$ mWcm or more, the gaps provided by the insulating matrix are sufficiently large so that the magnetic exchange coupling between the columnar-structured particles does not occur. On the other hand, in the range of $10^7$ mWcm or less, the volume occupation rate of the columnar-structured particles relative to the insulating matrix is sufficiently high. Therefore, it is possible to maintain excellent electromagnetic noise suppressing performance.

In general, a thin film having a conventional granular structure is fabricated by sputtering because oxide and a ferromagnetic metal must be simultaneously mixed. In the sputtering, kinetic energy of particles incident to a substrate is very high. Therefore, oxide and the ferromagnetic metal are uniformly mixed to produce a substantially amorphous state. Therefore, most of granular materials are subjected to a phase separation process by heat treatment to obtain the above-mentioned granular structure.

On the other hand, in the present invention, the material of the insulating matrix (such as oxide, nitride, or fluoride) and the ferromagnetic metal material of the columnar-structured particles (such as the pure metal of Fe, Co or Ni or the alloy formed by a combination thereof) are produced, for example, by multi-source deposition. The present inventors have found out that, in the vapor deposition, momentum of atoms or molecules of a material reaching a substrate is significantly smaller than that in the sputtering and it is therefore possible to form the columnar-structured particles in the insulating matrix by controlling the composition of the thin film material, a substrate material, and a deposition condition, thereby fabricating a thin film excellent in electromagnetic noise suppression performance. In this event, by the use of an appropriate material as the insulating matrix, well-separated columnar or rod-shaped fine particles (columnar-structured particles) can be formed without heat treatment. In this manner, a thin film excellent in soft magnetic property is obtained. In case where the above-mentioned multi-source deposition is used, a pure metal, an alloy, oxide, fluoride, nitride or the like may be mixed in an indefinite shape (in the present specification, "indefinite shape" means an irregular shape having no definite form) in the insulating matrix in addition to the columnar-structured particles of a regular shape. As the mixed amount of these substances in an indefinite shape is smaller, the thin film is more excellent in electromagnetic noise suppressing performance.

The particles obtained by the sputtering have an indefinite shape approximate to a spherical shape. On the other hand, by the vapor deposition, phase separation is achieved even without heat treatment so that the ferromagnetic metal forms long columnar-structured particles. Therefore, even an isolated ferromagnetic material exhibits a high magnetic permeability due to the shape magnetic anisotropy, as described before. In order to control the magnetic permeability, the length of the columnar-structured particle is controlled so as to change the shape magnetic anisotropy. The length of the columnar-structured particle is proportional to a time when a shutter of a ferromagnetic material evaporation source is open. Therefore, the length L of the columnar-structured particle can be controlled by a shutter open/close time. Since the width D of the columnar-structured particle can also be controlled by the composition and the substrate temperature, it is possible to control the dimension ratio (L/D; where L represents the length of the columnar-structured particle and D represents the width of the columnar-structured particle). Within the range satisfying 1<L/D representative of the uniaxial anisotropy as described above, if the dimension ratio L/D is reduced, Nd in the above formula (3) has a smaller value. In this event, the magnetic anisotropy is reduced so that the magnetic permeability increases. Simultaneously, the magnetic resonance frequency can also be changed from the relationship in the above formula (5).

Further, by changing a time when the shutter of the material of the columnar-structured particle is open during vapor deposition, it is possible to successively laminate a plurality of thin films having of a plurality of different resonance frequencies to thereby produce a continuous film having the plurality of different resonance frequencies. Under the above-mentioned control, sharp magnetic resonance absorption peaks slightly different from one another are combined so as to precisely control a magnetic loss in a desired frequency region. Thus, the above-mentioned technique is effective in order to enhance the performance as an electromagnetic wave suppressor.

In the conventional granular structure, the magnetic anisotropy is generated by coupling between particles. Therefore, the direction of the magnetic anisotropy is parallel to the film plane. Accordingly, the magnitude of the magnetic permeability sensitively changes depending on the direction of the magnetic anisotropy. That is, the magnitude of the magnetic permeability has a strong in-plane directivity.

On the other hand, in the electromagnetic noise suppressing thin film of the present invention, the magnetic anisotropy exists in a film thickness direction and there is no directivity in the film plane. That is, the electromagnetic noise suppressing thin film has a feature of exhibiting an isotropic magnetic permeability in the film plane, and is very effective when isotropic noise suppression performance is required. However, in a special situation where electromagnetic waves different in mode are selectively efficiently suppressed, presence of the in-plane directivity may be effective. In this event, in the vapor deposition, it is possible to control an angle of the particles incident to the substrate by changing an angle of the substrate with respect to the evaporation source. Therefore, the in-plane directivity can be imparted depending upon the intended use of the material. Thus, by adopting the above-mentioned method, the magnetic anisotropy inclined from the thickness direction to the in-plane direction is generated as the columnar-structured particles are inclined, so that the isotropic magnetic permeability is shifted to the magnetic permeability with directivity. In this event, it is possible to double the magnitude of the magnetic permeability in a certain direction, although the certain direction is limited to the predetermined direction. In order to especially increase the in-plane directivity, it is preferable that the longitudinal direction of the columnar-structured particles and the film thickness direction are generally perpendicular to each other.

As described above, according to the present invention, it is possible to impart the magnetic anisotropy of a desired intensity in a desired direction from the thickness direction to the in-plane direction so as to design and control the direction and the magnitude of the magnetic permeability, the resonance frequency, and the frequency band of the resonance frequency. In addition, a wide range of substrates may be selected because no heat treatment is required. Further, the thin film can be produced at a high speed.

Now, an embodiment of the present invention will be described with reference to the drawing.

deposition are equal to $1\times10^{-5}$ Torr or less and $1\times10^{-4}$ Torr or less, respectively. The substrate is water-cooled and is not particularly heated. Therefore, the substrate surface is continuously kept at 100° C. or less. In all samples, the total film thickness is about 1.5 μm. In the samples (a) and (b), polyimide is used as the substrate. In the samples (c) to (l), a glass substrate is used.

TABLE 1

| | sample | deposition method | compostion | resistance [μΩcm] | S11 max [dB] | S21 (2 GHz) [dB] | L/D |
|---|---|---|---|---|---|---|---|
| present invention | a | vapor deposition | $Ni_{34}Fe_9B_{22}O_{35}$ | 2.5E+04 | −15 | −18 | 370 |
| | b | vapor deposition | $Ni_{40}Fe_{10}Al_{25}N_{25}$ | 8.7E+03 | −12 | −20 | 350 |
| | c | vapor deposition | $Fe_{24}Co_{16}Mg_{20}F_{40}$ | 2.1E+04 | −18 | −18 | 450 |
| | d | vapor deposition | $Ni_{32}Fe_8Al_{15}B_{15}N_{30}$ | 4.2E+04 | −15 | −17 | 400 |
| | e | vapor deposition | $Fe_{16}Co_{16}Al_{11}Mg_{17}O_{40}$ | 6.3E+04 | −18 | −17 | 370 |
| | f | vapor deposition | $Fe_{37}Mg_{21}F_{42}$ | 3.6E+04 | −14 | −15 | 390 |
| | g | vapor deposition | $Ni_{43}Sr_{19}F_{38}$ | 2.0E+04 | −15 | −11 | 430 |
| | h | vapor deposition | $Fe_{12}Pt_{12}Al_{38}N_{38}$ | 8.2E+05 | −19 | −5 | 460 |
| comparative example | i | sputtering | $Ni_{64}Fe_{16}B_8O_{12}$ | 2.0E+02 | −4 | −19 | — |
| | j | vapor deposition | AlN | 3.8E+09 | −20 | 0 | — |
| | k | vapor deposition | $MgF_2$ | 1.3E+09 | −21 | 0 | — |
| | l | vapor deposition | $B_2O_3$ | 2.60E+09 | −20 | 0 | — |

A vapor deposition used in this experiment comprises a plurality of evaporation sources and is adapted to perform multi-source vapor deposition. By simultaneous vapor deposition using those evaporation sources, the above-mentioned electromagnetic noise suppressing thin film is obtained. In this embodiment, the composition is controlled by adjusting respective deposition rates. Not only the substrate but also each evaporation source is provided with the shutter. These shutters can independently be operable so that a single material film, a composite film, or a film obtained by laminating these films can be produced as desired. As a material of the columnar-structured particles, a pure metal or an alloy is used. As a material of the insulating matrix, an insulating material is used. For each element, an evaporation source is provided. However, with respect to oxygen, nitrogen, or fluorine forming the insulating matrix, the insulating matrix may be produced by the use of reactive vapor deposition by gas introduction.

Table 1 shows a list of samples according to the embodiment with different compositions.

For example, a sample represented by $Ni_{34}Fe_9B_{22}O_{35}$ has a structure in which a Ni—Fe alloy forms columnar-structured particles dispersed in a B—O matrix. The composition ratio is Ni—Fe:B–O=43:57. In this composition, the composition of the alloy forming the columnar-structured particles is Ni:Fe=79:21 and is expected to have a high magnetic permeability.

In this embodiment, all samples as examples of the present invention are deposited by multi-source deposition using an electron beam deposition apparatus. The ultimate vacuum upon production and the vacuum degree during FIG. 1 shows transmission electron microscopic images of the electromagnetic noise suppressing thin films (a) $Ni_{34}Fe_9B_{22}O_{35}$, (c) $Fe_{24}Co_{16}Mg_{20}F_{40}$, and (f) $Fe_{37}Mg_{21}F_{42}$ according to the present invention as observed in a film section and a transmission electron microscopic image of a granular structure thin film (i) $Ni_{64}Fe_{16}B_8O_{12}$ as a comparative example prepared by deposition using sputtering and heat treatment at 300° C. for one hour as observed in a film plane. In the electromagnetic noise suppressing thin films prepared according to the present invention, phase separation occurs even without heat treatment and the ferromagnetic metal forms long columnar-structured particles. On the other hand, in the comparative example produced by sputtering, it is observed that the particles have an indefinite shape approximate to a spherical shape due to the granular formation process.

Table 1 shows transmission characteristics S11 (reflection) and S21 (transmission) when each sample as the electromagnetic noise suppressing thin film is disposed on a transmission line (microstrip line). Herein, one of the parameters indicating an excellent electromagnetic noise suppression characteristic is S21. If S21 is significantly attenuated, the noise attenuation effect is high. Another indispensable characteristic is S11, which greatly depends upon the resistance value. If S11 is large, conduction noise is reflected so that a secondary trouble such as radiation may possibly occur.

In the present specification, the effect of S21 is described as "attenuation is large" or "attenuation is small". "Attenuation is large" represents that "S21" has a lower value (in case where S21 has a negative value as in this embodiment, the absolute value is greater), i.e., that the noise suppression effect is high. The effect of S11 is described as "small" or "large". "Small" represents that "S11" has a lower value (in case where S11 has a negative value as in this embodiment, the absolute value is large), i.e., that the reflection is small. Such characteristic is desired as the electromagnetic noise suppressing thin film.

As compared with the comparative examples (i) to (l), large attenuation is obtained with respect to S21 in each of the examples of the present invention. It is thus understood that the noise suppressing characteristic is excellent. Further, because the resistance is high, S11 has a small value as compared with the comparative example (i). From the above, it is understood that the examples of the present invention exhibit an excellent noise suppression effect. In (a) to (g) in which the alloy forming the columnar-structured particles is exclusively made of the element or elements selected from Fe, Co, and Ni, greater attenuation is obtained with respect to S21. In particular, (a) to (e) using a composition near to $Ni_{80}Fe_{20}$ or $Fe_{60}Co_{40}$ exhibit very excellent characteristics.

A difference in these S parameters (transmission characteristics) is observed depending upon the difference in material of the substrate. Therefore, the electromagnetic noise suppressing thin film according to this invention can be deposited not only on an inorganic insulating material such as a glass substrate but also on a metal material or a resin material. Thus, the material of the substrate is not specifically limited. Even if the thin film is deposited on a material, such as polyimide, used for a FPC, the columnar-structure layers can successively be formed. Thus, the electromagnetic noise suppressing thin film according to the present invention may be formed on a surface resin of a circuit board or a cable and is applicable to various purposes.

Figure 2A:
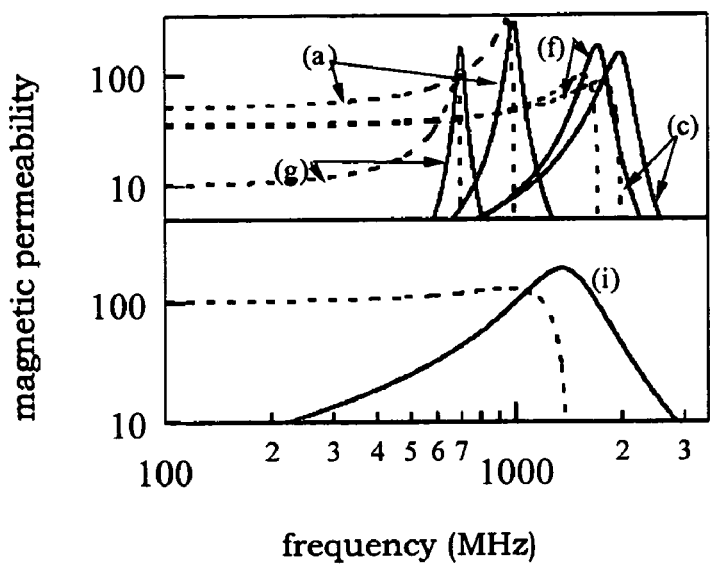
FIG. 2A is a diagram showing a frequency characteristic of a magnetic permeability of the thin film with respect to the sputter-deposition film in the comparative example (i) and the vapor-deposition films in the examples (a), (c), (f), and (g) of the present invention.

Referring to FIG. 2A, observation will be made of the frequency characteristics of the magnetic permeability in the examples (a), (c), (f), and (g) and the comparative example (i). In the comparative example (i), a resonance loss is observed in a wide frequency region and magnetic resonance in a desired frequency region can not be obtained. This is because the film has a structure in which magnetic coupling is present between the particles so that wide variance or dispersion of the magnetic permeability is observed around the magnetic resonance frequency.

Figure 2B:
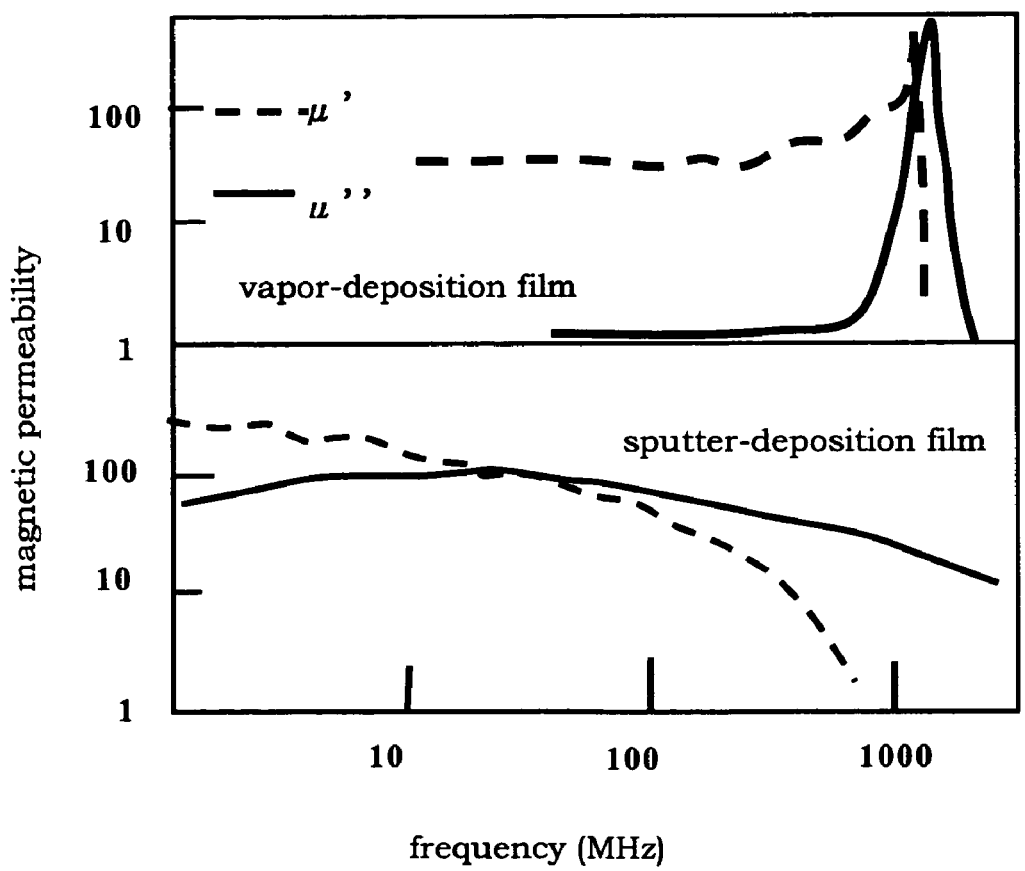
FIG. 2B is a view schematically showing features depending upon the difference in deposition technique.

On the other hand, in the examples of the present invention, a sharp magnetic resonance loss is obtained at a specific frequency. The reason is as follows. Since the magnetic anisotropy is generated by the well-arranged columnar-structured particles, no substantial variance or dispersion is observed and distinct magnetic resonance appears. In (a) using a composition near $Ni_{80}Fe_{20}$ as a metal component, a high magnetic permeability is obtained as compared with the other examples. In (c) or (f) using Fe or $Fe_{60}Co_{40}$, a high resonance frequency is obtained. This largely depends upon magnetization, crystal magnetic anisotropy, and the magnitude of magnetostriction as inherent characteristics of these metals. The above-mentioned feature is schematically shown in FIG. 2B.

Figure 3:
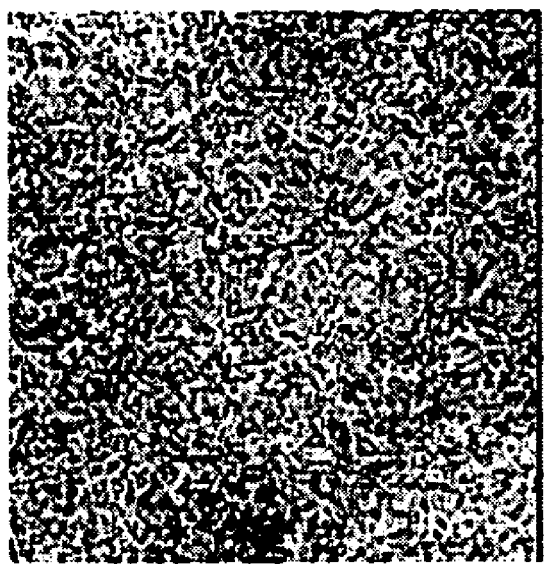
FIG. 3 is a top view showing magnetic force microscopic images of thin films obtained by vapor deposition in examples (c) and (m) of the present invention.
Figure 3:
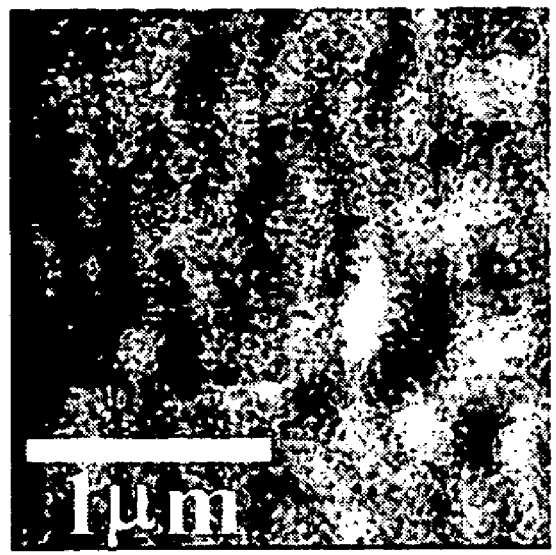

Table 2 shows the result of comparison of the noise suppression effect depending upon the difference in domain structure. Herein, the sample (m) is produced under the condition same as (c) with respect to the vacuum degree, the substrate temperature, and the total film thickness. Herein, multi domain and single domain are controlled by changing the deposition rate between the columnar-structured particles (metal) and the insulating matrix. As shown in FIG. 3, in case of (m), the columnar structure exhibits a multi-domain behavior as seen from the result of observation of the domain structure. In case of (c), the domain is considerably small and is not observed. It is understood that the size of the magnetic domain is several tens nanometers or less. From the above, it is supposed that the columnar structure exhibits a single-domain behavior in (c). Referring to Table 2, S11 in (c) exhibiting the single-domain behavior is small as compared with (m) exhibiting the multi-domain behavior. Thus, (c) has a characteristic preferable as the electromagnetic noise suppressing thin film.

TABLE 2

| sample | deposition method | composition | resistance [µΩcm] | S11 max [dB] | S21 (2 GHz) [dB] | L/D | domain |
|---|---|---|---|---|---|---|---|
| c | vapor deposition | $Fe_{24}Co_{16}Mg_{20}F_{40}$ | 2.1E+04 | −16 | −18 | 450 | single domain |
| m | vapor deposition | $Fe_{33}Co_{22}Mg_{15}F_{30}$ | 3.6E+03 | −9 | −10 | 420 | multi domain |

Figure 4A:
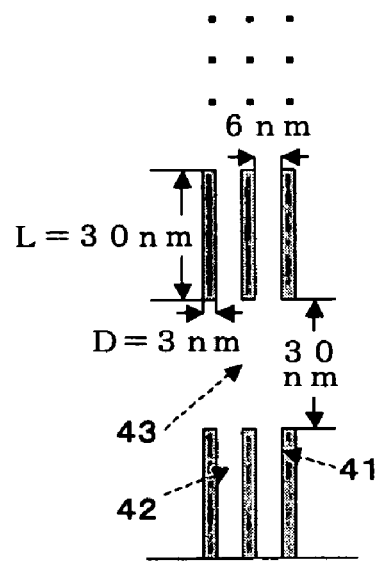
FIG. 4A is a schematic diagram showing a sample having a dimension ratio (L/D, where L represents the length of columnar-structured particle and D represents the width of the columnar-structured particle)
Figure 4B:
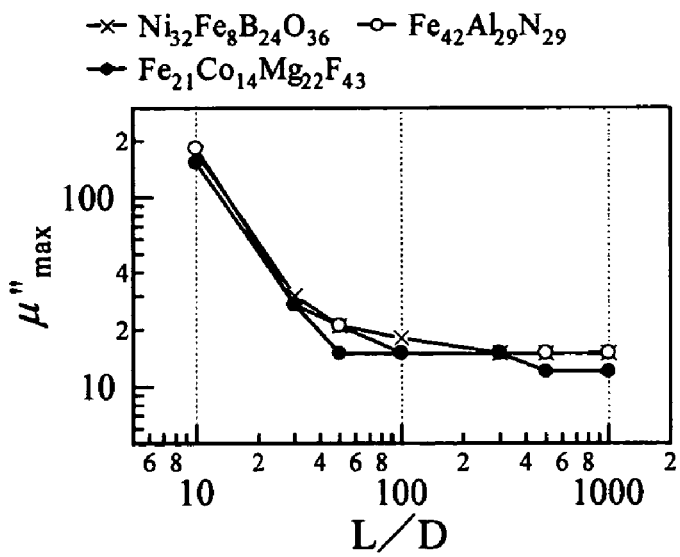
FIGS. 4B and 4C are views plotting a magnetic permeability and a resonance frequency of the sample illustrated in FIG. 4A, respectively, with respect to different dimension ratios.
Figure 4C:
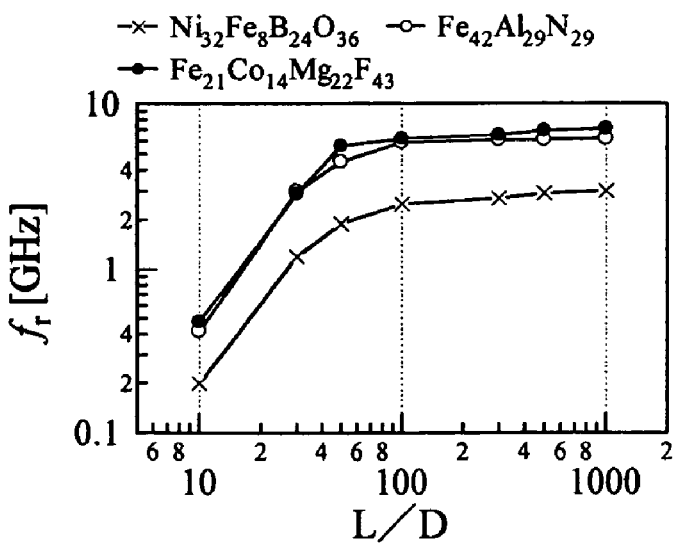

Referring to FIGS. 4A, 4B, and 4C, the magnetic permeability is controlled by controlling the dimension ratio of the columnar-structured particle (L/D, where L represents the length of the columnar-structured particle and D represents the width of the columnar-structured particle). As illustrated in the figures, examination was made about three compositions ($Ni_{37}Fe_8B_{24}O_{36}$, $Fe_{42}Al_{29}N_{29}$, $Fe_{21}Co_{14}Mg_{22}F_{43}$). The deposition condition is same as (c) with respect to the vacuum degree and the substrate temperature. FIG. 4A is an example where the dimension ratio is controlled so that D is 3 nm and the dimension ratio is 10 (L=30 nm). The dimension ratio is controlled by adjusting a time when the shutter located on the pure metal or the alloy to form the columnar-structured particles is opened while the deposition rate is kept constant. A gap 42 between the columnar-structured particles 41 in the diameter direction is controlled by D controlled by the substrate temperature and the ratio of the pure metal or the alloy to form the columnar-structured particles with respect to the insulating material. At this time, substrate heating is not performed. In all samples whose data are shown in FIGS. 4B and 4C, the ratio of the pure metal or the alloy is kept constant. Therefore, the gap 42 is controlled to a constant value of about 6 nm. On the other hand, a gap between the columnar-structured particles in the longitudinal direction is controlled to a constant value of 30 nm. Specifically, when the shutter positioned on the pure metal or the alloy to form the columnar-structured particles is closed, the insulating material alone is deposited to form a non-magnetic insulating layer 43 corresponding to the gap in the longitudinal direction. By repeating the above-mentioned step, a film having a structure in which the columnar-structure layers are magnetically separated by the insulating layer. Herein, the total film thickness is controlled to a constant value of about 1.5 mm in all samples. Thus, as illustrated in FIG. 4A, the columnar-structure layers having a dimension ratio L/D are separated by the insulating material of 30 nm in the thickness direction to form a laminated structure. Since the total thickness is 1.5 mm, the number of layers is increased as the L/D is smaller. Thus, even if the effect is weak by a single layer, a film having a high noise suppression effect can be obtained by laminating a plurality of layers.

FIGS. 4B and 4C show the maximum value of $\mu''$ and fr with respect to the dimension ratio when the dimension ratio is changed under the above-mentioned conditions. Herein, in the sample of L/D≦1, the easy magnetization axis is not uniaxial so that thermal fluctuation can not be suppressed and the superparamagnetism is exhibited. Therefore, a magnetic permeability characteristic preferable as the electromagnetic noise suppressing thin film can not be obtained. If L/D≧1000, the film is too thick and tends to be peeled off. From the result herein illustrated, it is understood that the magnetic permeability can accurately and precisely be controlled in the range of 1<L/D<1000, which has been difficult in the conventional granular thin film. In particular, in the range of 1<L/D<100, controllability is very excellent and the electromagnetic noise suppressing thin film exhibiting the noise suppression effect in a desired frequency band is easily produced by controlling the dimension ratio. Herein, the gaps between the columnar-structured particles in the diameter direction and in the longitudinal direction have constant values of 6 nm and 30 nm, respectively. It is noted that the gaps may have any value within a range such that magnetic coupling does not act between the columnar-structured particles. If these gaps are 1 nm or less, the above-mentioned magnetic coupling occurs so that the characteristic preferable as the electromagnetic noise suppressing thin film can not be obtained. On the other hand, if these gaps are 100 nm or more, noise suppressing components are extremely decreased. In this case also, the characteristic preferable as the electromagnetic noise suppressing thin film can not be obtained. In particular, if these gaps are 1000 nm or more, no substantial effect as the electromagnetic noise suppressing thin film can be obtained. If these gaps vary between 1 and 1000 nm, magnetostatic interaction acting between the columnar-structure layers is varied so that the data illustrated in FIGS. 4A and 4B are changed. Specifically, when the gap in the longitudinal direction is changed with L/D kept constant, fr is increased and the magnetic permeability is decreased as the above-mentioned gap is narrower. However, the ratio of the magnetic layer in the film is increased in correspondence to narrowing of the gap so that the decrease in magnetic permeability is small.

From the above-mentioned results, fr and the magnetic permeability in the electromagnetic noise suppressing thin film can be controlled also by changing the gaps.

In the figures being illustrated, it is assumed that the $Ni_{32}Fe_8B_{24}O_{36}$ alloy is used. Theoretically supposing that a single perfect columnar-structured particle is present without magnetic interaction, it is expected that the maximum value of fr exceeds 10 GHz. However, the maximum value in this embodiment is about 4 GHz or slightly smaller and is greatly different from the above-mentioned theoretical maximum value. The reason largely resides in imperfectness of the columnar-structured particles resulting from indistinct phase separation, although the influence of the magnetostatic interaction is slightly taken into account. In the results shown in FIGS. 4B and 4C, the data in the range of L/D<10 are not shown. The reason also resides in incompleteness of the columnar-structured particles. In view of the above, a substantially perfect columnar-structured particle is produced by fine processing. In this event, it is possible to control fr to a higher value. Further, even if L/D is in the range of 2 to 10, fr and the magnetic permeability are controllable.

Herein, if the columnar structures are not parallel to one another, variance or dispersion is caused in the magnetic anisotropy. Therefore, the characteristic desired as the electromagnetic noise suppressing thin film can not be obtained. In case where the longitudinal direction of the columnar-structured particles is substantially parallel to the film thickness direction, the isotropic magnetic permeability is obtained in the plane. Therefore, such material is very useful as the electromagnetic noise suppressing thin film.

With reference to the above-mentioned results, the shutter is opened and closed several times with its opening time varied. In this manner, it is possible to stack the columnar structures having a plurality of dimension ratios, i.e., having a plurality of different resonance frequencies in a single material.

Figure 5:
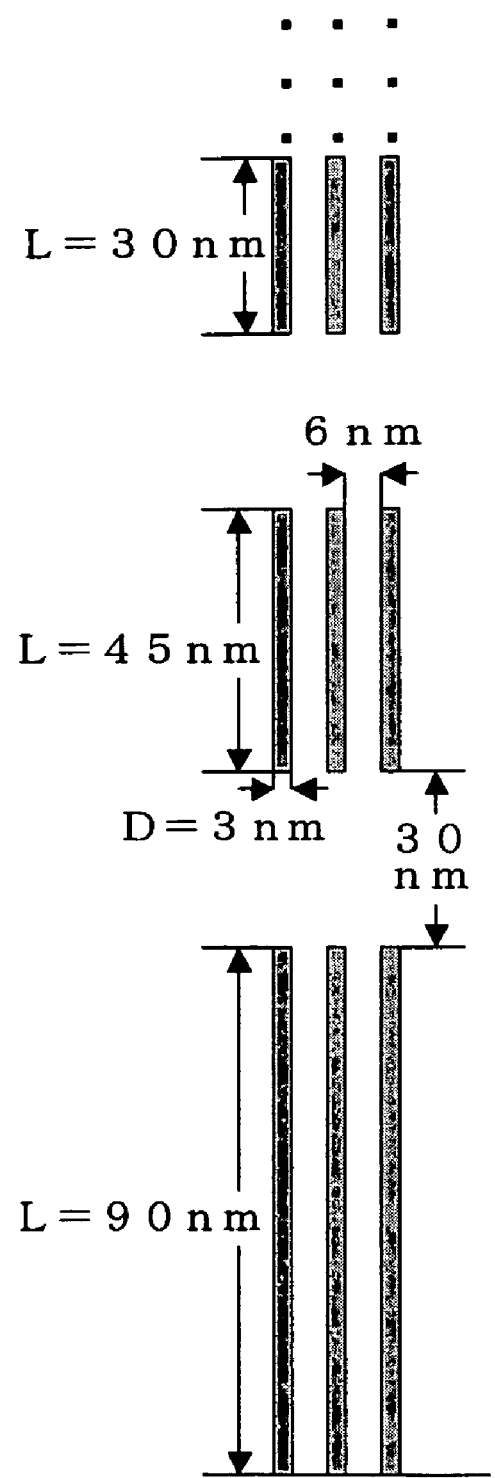
FIG. 5 is a schematic diagram showing a case where a single sample is prepared by laminating a plurality of layers of samples different in dimension ratio.
Figure 6A:
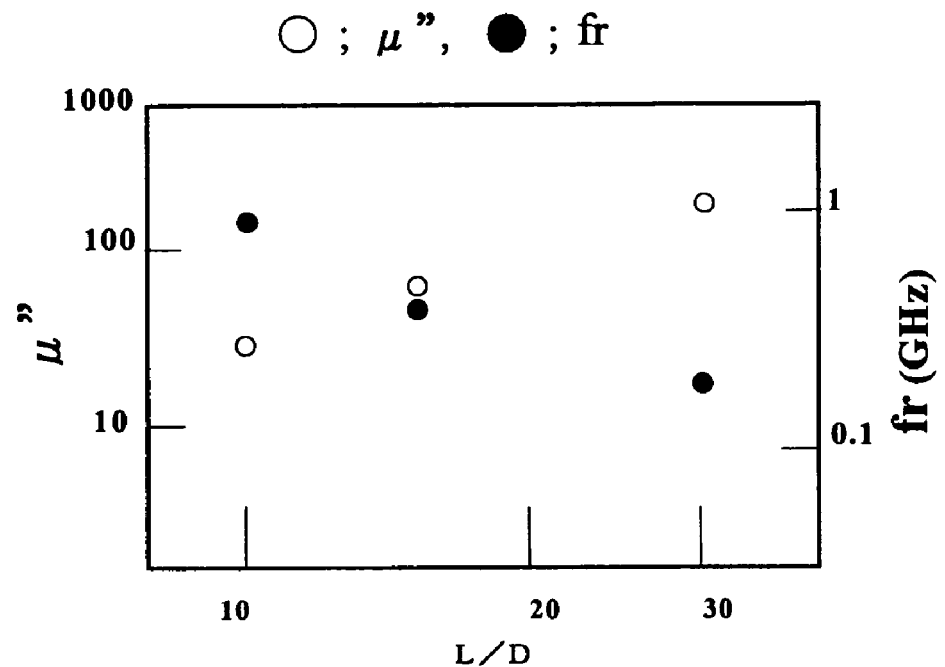
FIG. 6A is a view plotting a magnetic permeability and a resonance frequency expected in each of the layers different in dimension ratio and illustrated in FIG. 5.
Figure 6B:
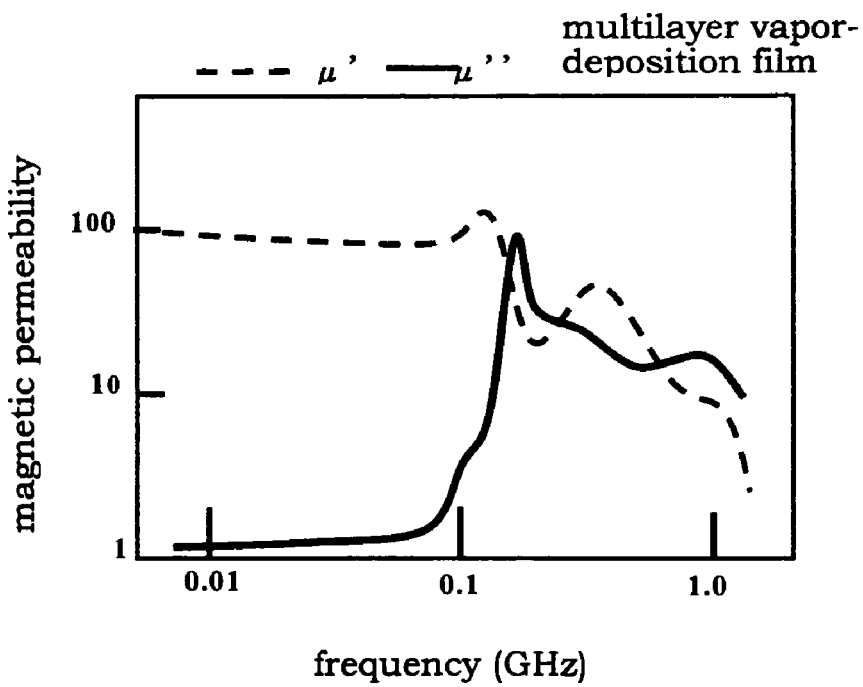
FIG. 6B is a view showing a result of measurement of the magnetic permeability for the sample illustrated in FIG. 5.
Figure 7A:
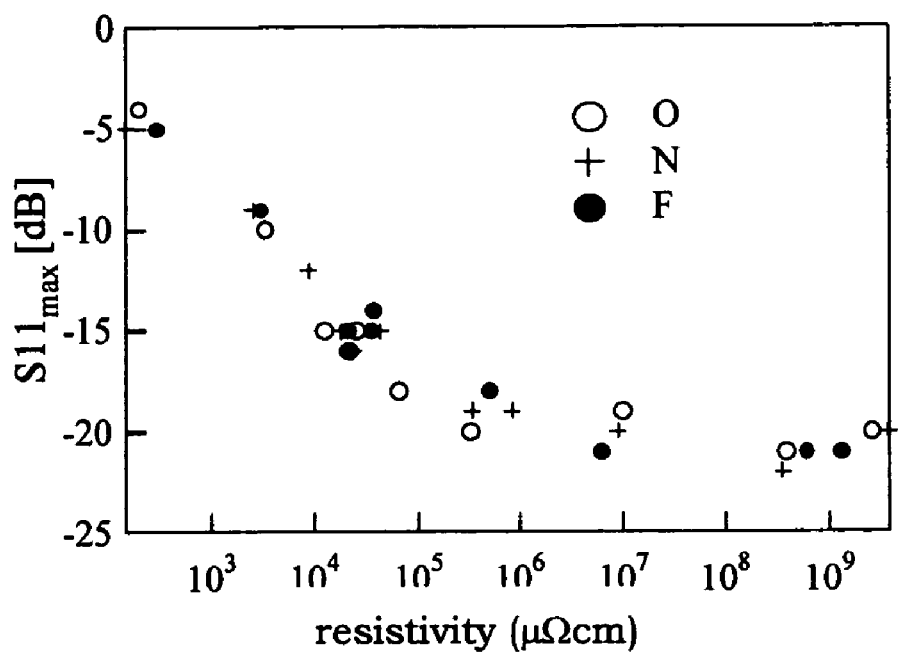
FIGS. 7A and 7B are views plotting S11 and S21 with respect to an electric resistivity in examples of the present invention, respectively.
Figure 7B:
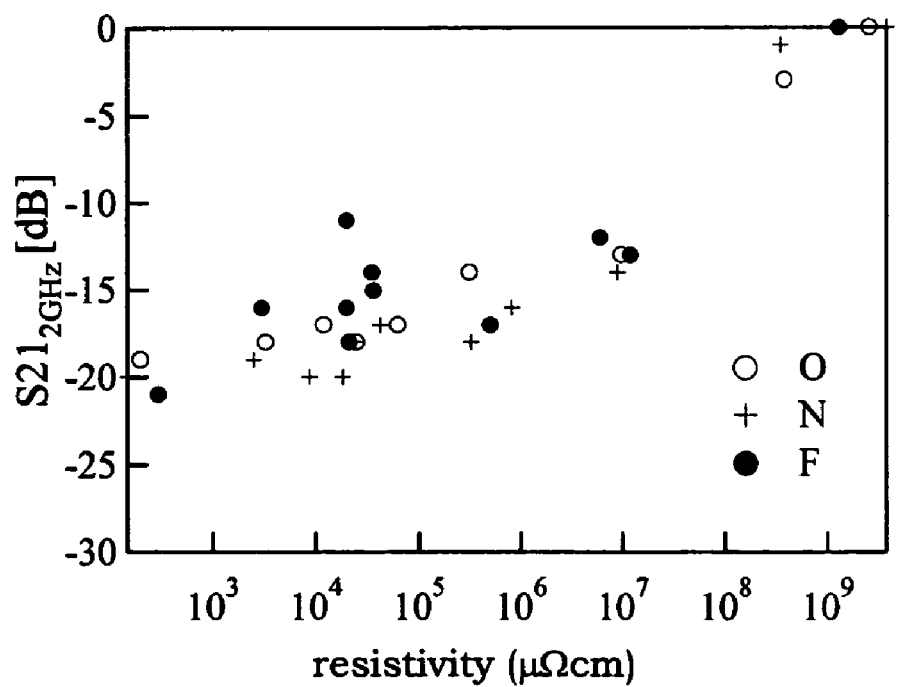

FIG. 5 shows a schematic diagram of a sample prepared by controlling the dimension ratios to 10, 15, and 30 in a single material. The composition of the sample used herein is $Ni_{36}Fe_9Mg_{18}F_{37}$. The condition is same as (c) with respect to the ultimate vacuum, the vacuum degree during deposition, the substrate temperature, and the substrate used herein. The total film thickness is about 1.5 μm. The gaps in the longitudinal direction and the diameter direction formed by $MgF_2$ in the columnar-structure layers and D have constant values of 30 nm, 6 nm, and 3 nm, respectively. FIGS. 6A and 6B are views plotting the maximum value of $\mu''$ and fr expected in the samples obtained herein on the basis of the above-mentioned results and the magnetic permeability characteristics of the sample actually prepared by stacking the columnar-structure layers different in dimension ratio. The magnetic permeability characteristic of the sample obtained herein exhibits the frequency profile as a combination of samples having magnetic resonance points in frequency bands exactly in conformity with a design, i.e., 200 MHz, 300 MHz, and 1 GHz. The composition of each of the samples is $Ni_{36}Fe_9Mg_{18}F_{37}$. The similar result is obtained in case where a pure metal of Fe, Co, or Ni, an alloy thereof, or a composition containing at least 20 weight % of Fe, Co, or Ni is used. FIGS. 7A and 7B show the maximum value of S11 with respect to the electric resistivity and S21 at 2 GHz in the electromagnetic noise suppressing thin films respectively using oxide (O), nitride (N), and fluoride (F) prepared in this experiment. The samples used to obtain the data herein illustrated are prepared under the condition same as in (c). S11 strongly depends upon the electric resistivity and monotonously decreases following the increase in resistivity. At the resistance of about $10^2$ μΩcm, S11 tends to increase up to about −5 dB. At the resistance of $10^3$ μΩcm or more, S11 is reduced to about −10 dB which is a practical level. As to S21, no strong dependency upon the resistivity is observed because the samples may be different in permeability even if the resistance is same. At the resistance of $10^8$ μΩcm or more, the attenuation of about 5 dB is achieved. At the resistance of $10^9$ μΩcm or more, no substantial noise suppression effect is observed.

Figure 8A:
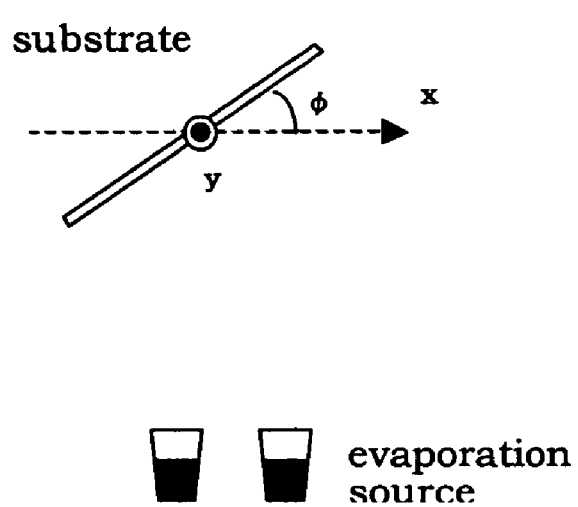
FIGS. 8A and 8B are views for describing an example in which a substrate is inclined to control an in-plane directivity of the magnetic permeability, FIG. 8A showing an evaporation source, the substrate, and a substrate inclination angle, FIG. 8B showing a measurement direction of μ.
Figure 8B:
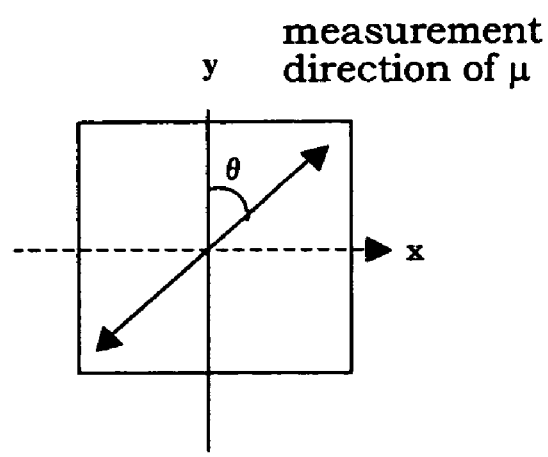
Figure 9A:
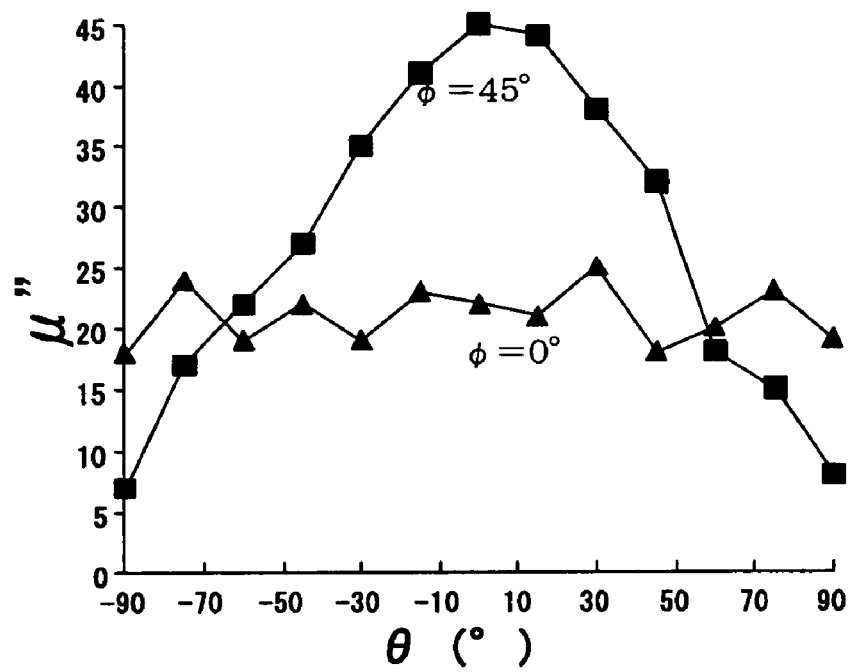
FIGS. 9A and 9B are views showing an in-plane angle dependency of the magnetic permeability in the example illustrated in FIG. 8A in which the in-plane directivity of the magnetic permeability is controlled by inclining the substrate.
Figure 9B:
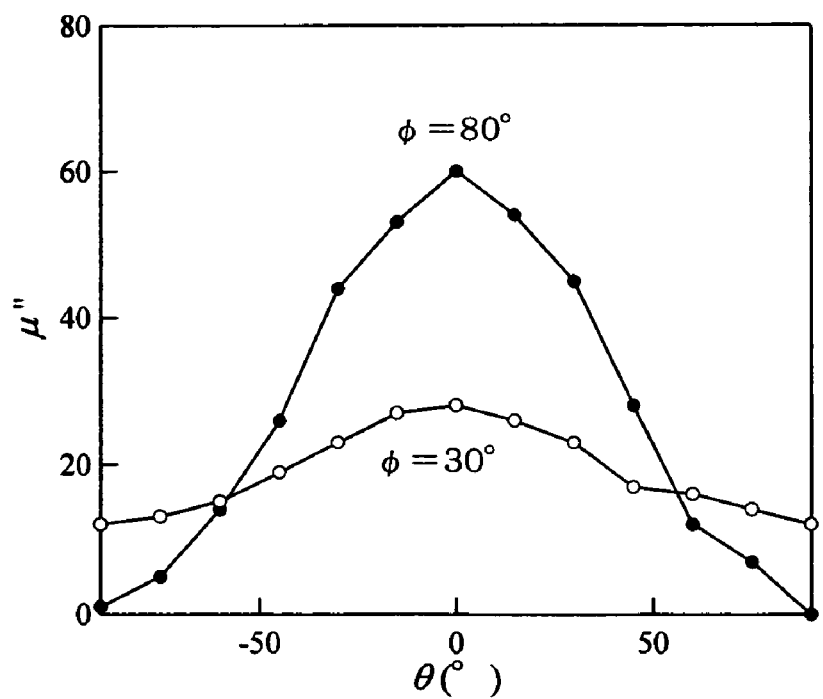

Referring to FIGS. 8A, 8B, 9A, and 9B, description will be made of the case where the substrate is inclined to control the in-plane directivity of the magnetic permeability. FIG. 8A is a schematic view showing an arrangement of the substrate with respect to the evaporation source. FIG. 8B schematically shows an angular arrangement upon measuring the magnetic permeability with an angle changed in the plane. Herein, φ represents an angle formed by an XY plane and the substrate in FIG. 8A and θ represents an angle within the substrate plane in FIG. 8B. The samples are prepared under the condition same as in (c) with respect to the vacuum degree, the substrate temperature, and the substrate used. The composition of the sample is $Ni_{32}Fe_8Al_{30}N_{30}$. The substrate angle $\phi$ is changed to 0°, 30°, 45°, and 80°. FIGS. 9A and 9B show the angle dependency of the magnetic permeability in the plane in the samples prepared at the respective values of $\phi$. In the samples of $\phi=0°$ prepared in the state where the substrate is faced to the evaporation source and in the sample of $\phi=30°$, the magnetic permeability is substantially constant irrespective of q and no in-plane directivity appears. However, in the samples prepared at the inclinations of $\phi=45°$ and $\phi=80°$, strong directivity appears. When the measurement direction of $\mu$ is a direction y ($\theta=0°$) in FIGS. 9A and 9B, the magnetic permeability is increased. This tendency is remarkable as the value of $\phi$ is greater. Further, as the value of $\phi$ is greater, the maximum value of $\mu''$ is greater also. In particular, in the sample of $\theta=80°$, the magnetic permeability is substantially equal to zero when $\theta=90°$. Therefore, a perfect directivity is observed. Thus, in case where the film is required to have the in-plane directivity, the film obtained in this invention is very effective. The composition of each sample is $Ni_{32}Fe_8Al_{30}N_{30}$. However, the similar result is obtained in case where the pure metal of each of Fe, Co, and Ni, the alloy thereof, or the composition containing at least 20 weight % of Fe, Co, or Ni is used.

Next, the electromagnetic noise suppression effect of the electromagnetic noise suppressing thin film obtained in the present invention is examined.

Figure 10:
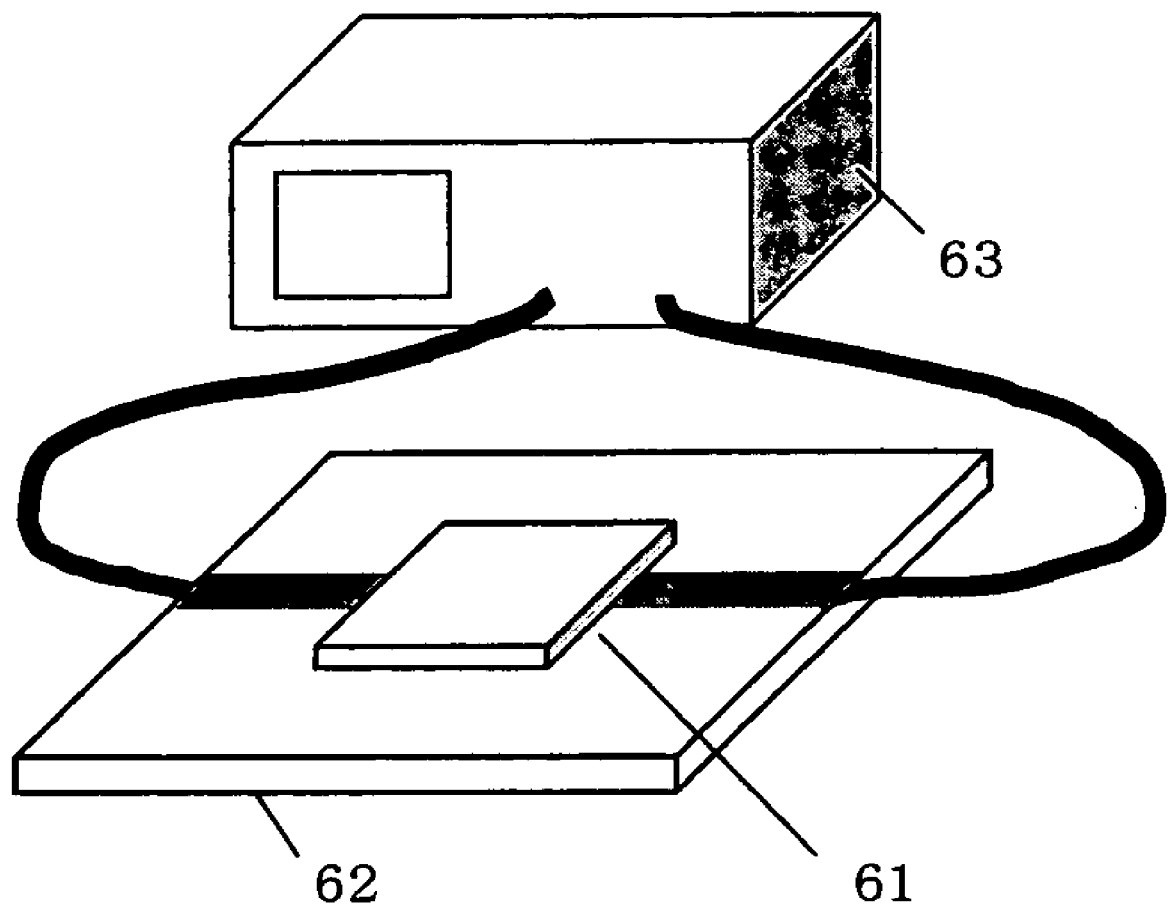
FIG. 10 shows a general structure of an apparatus for verifying an electromagnetic noise suppression effect.

As shown in FIG. 10, an electromagnetic noise suppressing thin film sample 61 obtained in the present invention is disposed on a microstrip line 62 comprising a microstrip conductor formed on an insulating substrate. Both ends of the microstrip line 62 are connected to a network analyzer 63, thereby observing transmission characteristics S11 and S21. The transmission characteristics in Tables 1 and 2 are measured also by this measurement system. Table 3 shows the composition and the resistivity of the samples used in this experiment, i.e., the sample (c) as the example of the present invention and the comparative example prepared by deposition using sputtering and heat treatment at 300° C. for one hour and having a granular structure. Each sample has a total film thickness of up to 1.5 μm.

TABLE 3

| sample | | deposition method | composition | resistance [μΩcm] |
|---|---|---|---|---|
| example of the present invention | c | vapor deposition | $Fe_{24}Co_{16}Mg_{20}F_{40}$ | 2.1E+04 |
| comparative example | n | sputtering | $Fe_{24}Co_{16}Mg_{20}F_{40}$ | 2.0E+04 |

Figure 11A:
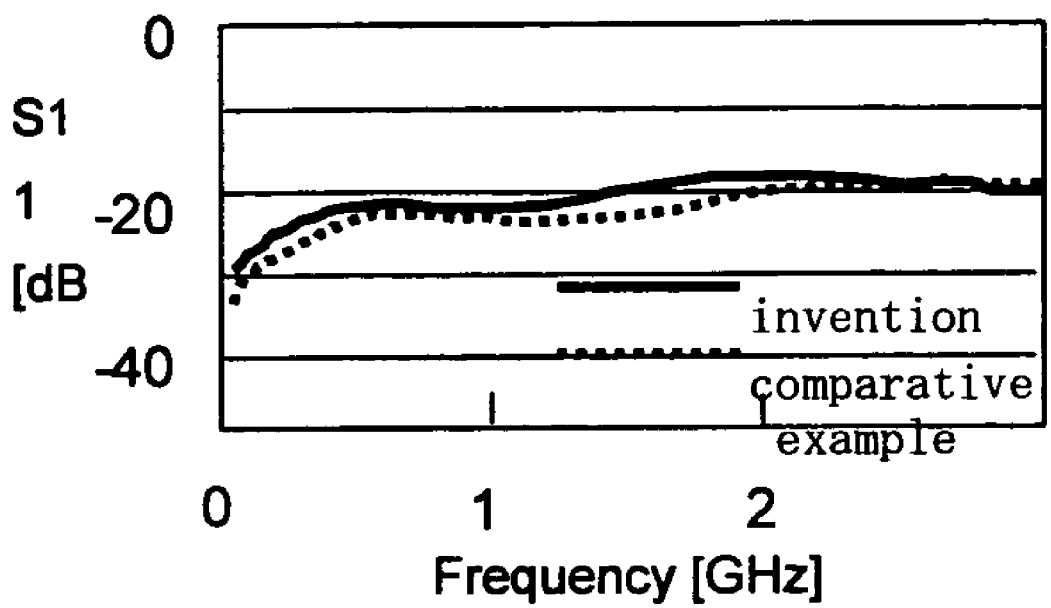
FIGS. 11A and 11B are views showing transmission characteristics S11 (reflection) and S21 (transmission), respectively, in case where an electromagnetic noise suppressing thin film prepared according to this invention is placed on a transmission line.
Figure 11B:
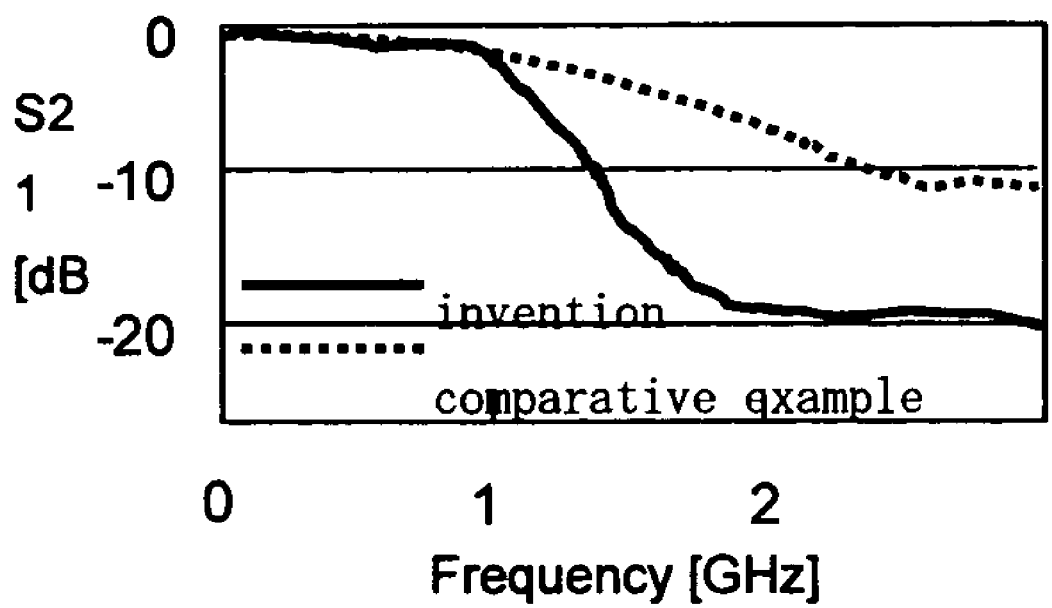

FIGS. 11A and 11B show results of examining S11 and S21 when the samples shown in Table 3 are disposed on a microstrip line, respectively. As is obvious from FIG. 11A, the measurement results of the transmission characteristic S11 indicating the reflection are not much different between the example of the present invention and the comparative example. In case where either sample is used, the reflection of a practical level is measured. On the other hand, for the transmission characteristic S21 indicating the transmission loss, the sample of the present invention exhibits a greater attenuation as compared with the comparative sample as is obvious from FIG. 11B. Thus, the effect of electromagnetic noise suppression is high.

Figure 12A:
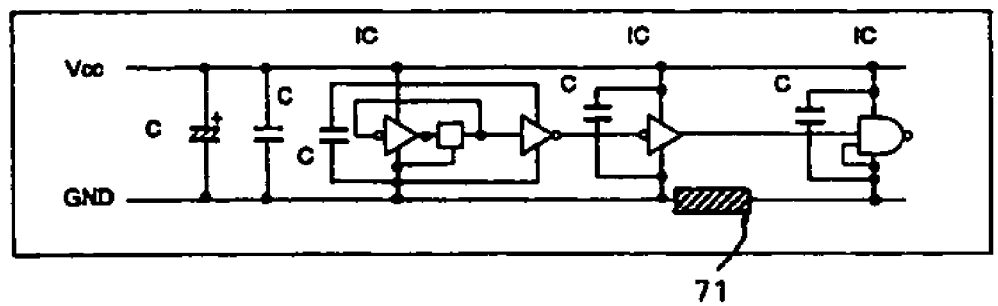
FIG. 12A is a top plan view of a circuit board with active devices mounted thereon, in which an electromagnetic noise suppressing thin film according to an embodiment of the present invention is formed on a ground line.
Figure 12B:
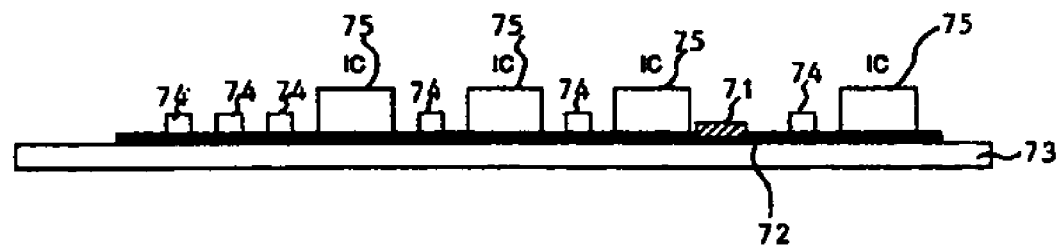
FIG. 12B is a side view of the electromagnetic noise suppressing thin film illustrated in FIG. 12A.
Figure 13:
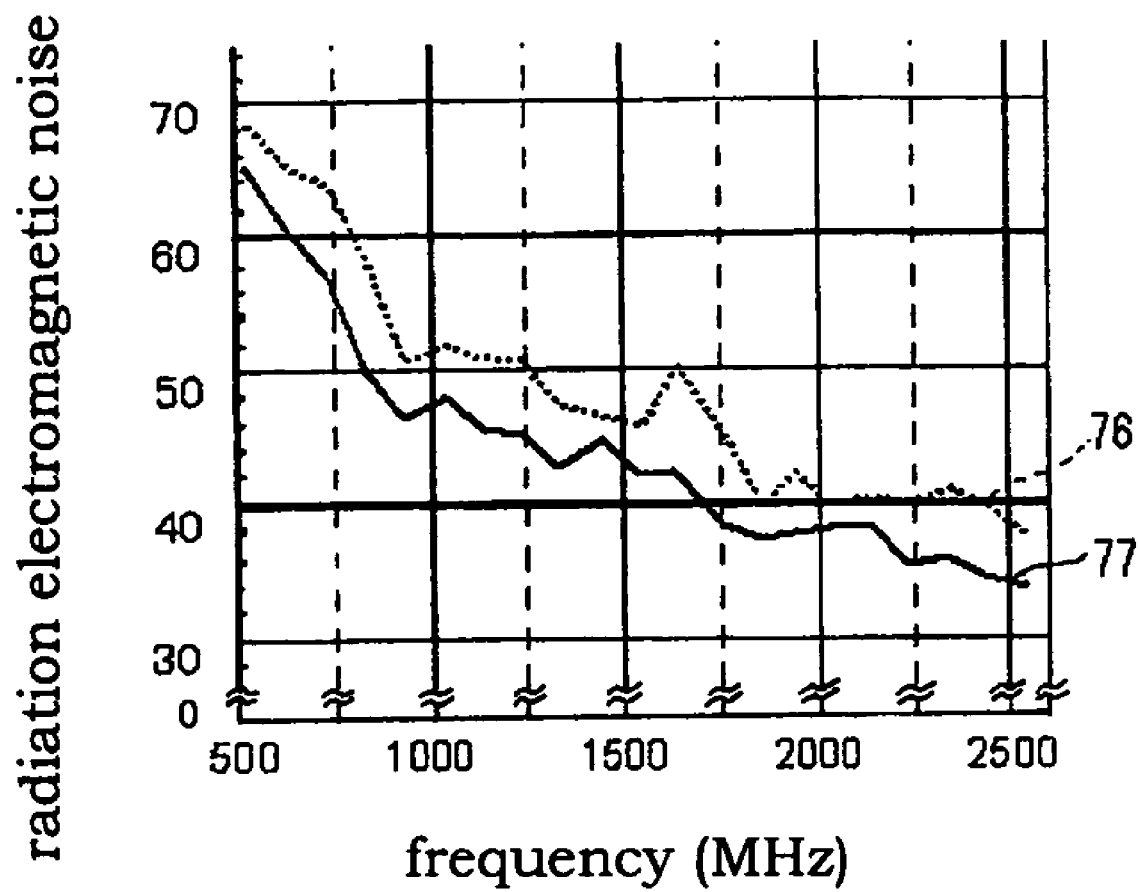
FIG. 13 is a diagram showing a radiation noise reduction effect of the electromagnetic noise suppressing thin film illustrated in FIG. 12B.

FIG. 12A is a top plan view showing one example of a circuit board with active elements mounted thereon, in which the electromagnetic noise suppressing thin film of the present invention is disposed on a ground line. The figure is schematically shown as a circuit diagram. FIG. 12B is a side view of the electromagnetic noise suppressing thin film 71 in FIG. 12A. FIG. 13 is a view showing the radiation noise reduction effect of the electromagnetic noise suppressing thin film in FIGS. 12A and 12B.

As shown in FIGS. 12A and 12B, an electromagnetic noise suppressing thin film 71 according to the present invention is formed on a part of a ground line 72 on a circuit board 73 with ICs 75 as active elements mounted thereon. Then, comparison is made of radiation electromagnetic noise generated during operation of this circuit. Herein, C represents an passive circuit element 74 such as a capacitor.

In FIG. 13, the radiation electromagnetic noise level indicated by a solid-line curve 77 is observed during operation of the circuit with the electromagnetic noise suppressing thin film deposited on a part of the circuit board. On the other hand, the radiation electromagnetic noise level indicated by a broken-line curve 76 is observed in the comparative example without the electromagnetic noise suppressing thin film. As seen from the figure, the radiation electromagnetic noise level is largely attenuated in the circuit with the electromagnetic noise suppressing thin film, as compared with the circuit without such thin film. Thus, it has been confirmed that the effective electromagnetic noise reduction effect can be achieved according to the present invention.

In the above-mentioned embodiment of the present invention, description has been directed only to the case where the electromagnetic noise suppressing thin film is formed on the circuit board with the active elements mounted thereon, for example, on the ground line. However, it will readily be understood that the electromagnetic noise reduction effect can be achieved by directly forming the electromagnetic noise suppressing thin film in an electronic component including a similar circuit board, at a part of a data line, on an active element, or at a portion of an electronic component having active elements where a high-frequency current flows, for example, on a metal casing.

As described above, the electromagnetic noise suppressing thin film according to the embodiment of the present invention has the excellent magnetic permeability characteristic, particularly the excellent imaginary-part magnetic permeability characteristic, at a high frequency. The electromagnetic noise suppressing thin film exhibits the excellent noise suppression effect at a high frequency and, therefore, is quite effective in suppressing the high-frequency electromagnetic noise which becomes a serious problem in recent years.

Further, according to the present invention, it is possible to provide the electromagnetic noise suppressing thin film having the columnar structure which is capable of suppressing superparamagnetism and increasing an electric resistance and which is capable of controlling the spin resonance phenomenon.

An electromagnetic noise suppressing thin film according to the present invention can suppress a high-frequency current acting as noise and, therefore, can be used in an electronic device or electrical device such as a personal computer and a mobile terminal.

While this invention has thus far been described in connection with the preferred embodiment thereof, it will be readily possible for those skilled in the art to put this invention into practice in various other manners without departing from the scope set forth in the appended claims.

What is claimed is:

1. An electromagnetic noise suppressing thin film having a structure including an inorganic insulating matrix made of oxide, nitride, fluoride, or a mixture thereof and columnar-structured particles made of a pure metal of Fe, Co, or Ni or an alloy containing at least 20 weight % of Fe, Co, or Ni and buried in the inorganic insulating matrix, and each columnar-structured particle has an easy magnetization axis in a longitudinal direction thereof and a plurality of the columnar-structured particles are arranged substantially parallel to one another in a diameter direction via the insulating matrix to form a repetitive structure, the columnar-structured particles having a dimension ratio L/D, where L represents the length of the columnar-structured particle and D represents the width of the columnar-structured particle, in the range of $1<L/D<1000$.

2. The electromagnetic noise suppressing thin film according to claim 1, wherein the columnar-structured particles are made of a metal having a composition of $Ni_xFe_{(100-x)}$ alloy ($75<x<85$ at %), iron, or a composition of $Fe_yCo_{(100-y)}$ alloy ($50<y<70$ at %).

3. The electromagnetic noise suppressing thin film according to claim 1, wherein L/D is in the range of $100 \leq L/D \leq 1000$.

4. The electromagnetic noise suppressing thin film according to claim 1, wherein the thickness of the insulating matrix present in a gap between columnar-structured particles is in the range of 1 nm to 1000 nm.

5. The electromagnetic noise suppressing thin film according to claim 1, wherein each columnar-structured particle has an easy magnetization axis in a longitudinal direction thereof and a plurality of the columnar-structured particles are arranged to be stacked on one another in the longitudinal direction via the inorganic insulating matrix to form a repetitive structure.

6. The electromagnetic noise suppressing thin film according to claim 5, wherein, in the longitudinal direction of the columnar-structured particles, a gap between every adjacent ones of the columnar-structured particles or a thickness of the insulating matrix present in the gap is in the range of 1 nm to 1000 nm.

7. The electromagnetic noise suppressing thin film according to claim 5, wherein the electromagnetic noise suppressing thin film comprises a plurality of columnar structure layers stacked on one another, each of the columnar structure layers being a magnetic layer comprising the columnar-structured particles different in dimension ratio L/D, where L represents the length of the columnar-structured particle and D represents the width of the columnar-structured particle, from those in the other columnar structure layers.

8. The electromagnetic noise suppressing thin film according to claim 7, wherein the magnetic layers comprising the columnar-structured particles different in dimension ratio L/D are stacked on one another via the insulating matrix having a thickness t, the electromagnetic noise suppressing thin film having a plurality of different magnetic resonance frequencies equal to or smaller in number than the number of the magnetic layers.

9. The electromagnetic noise suppressing thin film according to claim 1, wherein a saturation magnetostrictive constant of the electromagnetic noise suppressing thin film has an absolute value $|\lambda_s|$ within the range of $|\lambda_s|<60$ ppm.

10. The electromagnetic noise suppressing thin film according to claim 1, wherein the electromagnetic noise suppressing thin film has a d.c. resistivity within the range of $10^2$ to $10^9$ μΩcm.

11. The electromagnetic noise suppressing thin film according to claim 1, wherein the electromagnetic noise suppressing thin film has a d.c. resistivity within the range of $10^4$ to $10^7$ μΩcm.

12. The electromagnetic noise suppressing thin film according to claim 1, wherein a longitudinal direction of the columnar-structured particles is substantially parallel to a thickness direction of the electromagnetic noise suppressing thin film.

13. The electromagnetic noise suppressing thin film according to claim 1, wherein a longitudinal direction of the columnar-structured particles is inclined by an average angle θ with respect to a thickness direction of the electromagnetic noise suppressing thin film, the average angle φ falling within the range of $0 \leq \phi \leq 90°$.

14. The electromagnetic noise suppressing thin film according to claim 1, wherein a longitudinal direction of the columnar-structured particles is inclined by an average angle φ with respect to a thickness direction of the electromagnetic noise suppressing thin film, the average angle f falling within the range of $45 \leq \phi \leq 90°$.

15. The electromagnetic noise suppressing thin film according to claim 1, wherein a longitudinal direction of the columnar-structured particles is inclined by an average angle φ with respect to a thickness direction of the electromagnetic noise suppressing thin film, the average angle f falling within the range of $80 < \phi \leq 90°$.

16. A circuit board including an interconnection line provided with the electromagnetic noise suppressing thin film according to claim 1.

17. An electromagnetic noise suppressing thin film having a structure including an inorganic insulating matrix made of oxide, nitride, fluoride, or a mixture thereof and columnar-structured particles made of a pure metal of Fe, Co, or Ni or an alloy containing at least 20 weight % of Fe, Co, or Ni and buried in the inorganic insulating matrix, wherein the columnar-structured particles exhibit a single-domain behavior, and each columnar-structured particle has an easy magnetization axis in a longitudinal direction thereof and a plurality of the columnar-structured particles are arranged substantially parallel to one another in a diameter direction via the insulating matrix to form a repetitive structure, the columnar-structured particles having a dimension ratio L/D, where L represents the length of the columnar-structured particle and D represents the width of the columnar-structured particle, in the range of $1<L/D<1000$.

18. The electromagnetic noise suppressing thin film according to claim 17, wherein the columnar-structured particles are made of a metal having a composition of $Ni_xFe_{(100-x)}$ alloy ($75 \leq x \leq 85$ at %), iron, or a composition of $Fe_yCo_{(100-y)}$ alloy ($50 \leq y \leq 70$ at %).

19. The electromagnetic noise suppressing thin film according to claim 17, wherein a thickness of the insulating matrix present in a gap between adjacent columnar-structured particles is in the range of 1 nm to 1000 nm.

20. The electromagnetic noise suppressing thin film according to claim 17, wherein each columnar-structured particle has an easy magnetization axis in a longitudinal direction thereof and a plurality of the columnar-structured particles are arranged substantially parallel to one another in a diameter direction via the insulating matrix to form a repetitive structure.

21. The electromagnetic noise suppressing thin film according to claim 20, wherein a gap between every adjacent ones of the columnar-structured particles in the diameter direction of the columnar-structured particles or a thickness of the insulating matrix present in the gap is in the range of 1 nm to 1000 nm.

22. The electromagnetic noise suppressing thin film according to claim 20, wherein, in the diameter direction of the columnar-structured particles, a gap between every adjacent ones of the columnar-structured particles or a thickness of the insulating matrix present in the gap is in the range of 1 nm to 100 nm.

23. The electromagnetic noise suppressing thin film according to claim 20, wherein the electromagnetic noise suppressing thin film comprises a plurality of columnar structure layers stacked on one another, each of the columnar structure layers being a magnetic layer comprising the columnar-structured particles different in dimension ratio L/D, where L represents the length of the columnar-structured particle and D represents the width of the columnar-structured particle, from those in the other columnar structure layers.

24. The electromagnetic noise suppressing thin film according to claim 17, wherein a saturation magnetostriction constant of the electromagnetic noise suppressing thin film has an absolute value $|\lambda_s|$ within the range of $|\lambda_s| \leq 60$ ppm.

25. The electromagnetic noise suppressing thin film according to claim 17, wherein the electromagnetic noise suppressing thin film has a d.c. resistivity within the range of $10^2$ to $10^9$ μΩcm.

26. The electromagnetic noise suppressing thin film according to claim 17, wherein the electromagnetic noise suppressing thin film has a d.c. resistivity within the range of $10^4$ to $10^7$ μΩcm.

27. The electromagnetic noise suppressing thin film according to claim 17, wherein a longitudinal direction of the columnar-structured particles is substantially parallel to a thickness direction of the electromagnetic noise suppressing thin film.

28. The electromagnetic noise suppressing thin film according to claim 27, wherein the magnetic layers comprising the columnar-structured particles different in dimension ratio L/D are stacked on one another via the insulating matrix having a thickness t, the electromagnetic noise suppressing thin film having a plurality of different magnetic resonance frequencies equal to or smaller in number than the number of the magnetic layers.

29. The electromagnetic noise suppressing thin film according to claim 17, wherein a longitudinal direction of the columnar-structured particles is inclined by an average angle φ with respect to a thickness direction of the electromagnetic noise suppressing thin film, the average angle φ falling within the range of 0<φ<90°.

30. A circuit board including an interconnection line provided with the electromagnetic noise suppressing thin film according to claim 17.

31. An electromagnetic noise suppressing thin film having a structure including an inorganic insulating matrix made of oxide, nitride, fluoride, or a mixture thereof and columnar-structured particles made of a pure metal of Fe, Co, or Ni or an alloy containing at least 20 weight % of Fe, Co, or Ni and buried in the inorganic insulating matrix, and each columnar-structured particle has an easy magnetization axis in a longitudinal direction thereof and a plurality of the columnar-structured particles are arranged substantially parallel to one another in a diameter direction via the insulating matrix to form a repetitive structure, wherein the columnar-structured particles are made of a metal having a composition of $Ni_xFe_{(100-x)}$ alloy (75≦x≦85 at %), iron, or a composition of $Fe_yCo_{(100-y)}$ alloy (50≦y≦70 at %).

32. An electromagnetic noise suppressing thin film having a structure including an inorganic insulating matrix made of oxide, nitride, fluoride, or a mixture thereof and columnar-structured particles made of a pure metal of Fe, Co, or Ni or an alloy containing at least 20 weight % of Fe, Co, or Ni and buried in the Inorganic insulating matrix, wherein the columnar-structured particles exhibit a single-domain behavior, and each columnar-structured particle has an easy magnetization axis in a longitudinal direction thereof and a plurality of the columnar-structured particles are arranged substantially parallel to one another in a diameter direction via the insulating matrix to form a repetitive structure, the columnar-structured particles are made of metal having a composition of $Ni_xFe_{(100-x)}$ alloy (75≦x≦85 at %), an iron, or a composition of $Fe_yCo_{(100-y)}$ alloy (50≦y≦70 at %).

* * * * *